United States Patent

DeWitt

[15] 3,707,656

[45] Dec. 26, 1972

[54] TRANSISTOR COMPRISING LAYERS OF SILICON DIOXIDE AND SILICON NITRIDE

[72] Inventor: David DeWitt, Poughkeepsie, N.Y.

[73] Assignee: International Business Machines Corporation, Armonk, N.Y.

[22] Filed: Feb. 19, 1971

[21] Appl. No.: 117,077

Related U.S. Application Data

[63] Continuation of Ser. No. 572,119, Aug. 12, 1966, abandoned.

[52] U.S. Cl. .................................. 317/235, 317/234

[51] Int. Cl. .............................................. H01l 11/14

[58] Field of Search ............. 317/234, 235, 238–241, 317/21.1, 46.5

[56] References Cited

UNITED STATES PATENTS

| | | | |
|---|---|---|---|
| 3,246,173 | 4/1966 | Silver | 317/235 X |
| 3,290,613 | 12/1966 | Theriault | 331/117 |
| 3,333,168 | 7/1967 | Hafstein | 317/235 |
| 3,373,051 | 3/1968 | Chu et al. | 117/106 |
| 3,374,406 | 3/1968 | Wallmark | 317/235 |
| 3,422,321 | 1/1969 | Tombs | 317/234 |
| 3,438,873 | 4/1969 | Schmidt | 156/3 |
| 3,484,313 | 12/1969 | Tauchi et al | 148/187 |
| 3,597,667 | 8/1971 | Horn | 317/235 |

OTHER PUBLICATIONS

Tombs et al: "A New Insulated-Gate Silicon Transistor," Proceedings of the IEEE, January, 1966, pages 87–88.

Sah: "Characteristics of the Metal-Oxide-Semiconductor Transistors," IEEE Transactions on Electron Devices, July, 1964, pages 324–345.

*Primary Examiner*—James D. Kallam

*Attorney*—Hanifin and Clark and Harry M. Weiss

[57] ABSTRACT

A semiconductor structure in which a substrate having surface regions of opposite type conductivity is covered with two different insulating layers. In a specific structure, the regions in the substrate form an isolated gate field effect transistor with a thin layer of silicon nitride forming the insulation in the gate portion and a thicker layer of silicon dioxide forming the insulation over the remainder of the device.

12 Claims, 13 Drawing Figures

INVENTOR
DAVID DeWITT

BY Harry M Weiss
ATTORNEY

TRANSISTOR COMPRISING LAYERS OF SILICON DIOXIDE AND SILICON NITRIDE

This application is a continuation of application Ser. No. 572,119, now abandoned.

This invention relates to improved semiconductor devices and fabrication methods therefor and, more particularly, to the use of two insulating materials including silicon nitride for semiconductor device applications.

Previously, semiconductor devices were fabricated with any one of various types of insulating or passivating coatings which included either silicon nitride, silicon dioxide, etc. However, in the fabrication of either active (transistor, diode, etc.) or passive (resistor, capacitor, etc.) semiconductor devices it was not realized that the use of more than one insulating material would provide definite advantages in device design and use. In fact, it was not evident that combining various insulators would provide any useful result in semiconductor device fabrication since the use of more than one type of insulator appears to be unnecessary and redundant besides possibly adding substantial cost and complexity to semiconductor device fabrication.

Accordingly, it is an object of this invention to provide an improved semiconductor device.

It is another object of this invention to provide an improved semiconductor device utilizing different insulating materials having special electrical properties and characteristics.

It is a still further object of this invention to provide a surface passivated semiconductor device utilizing silicon nitride and another insulating material.

It is still another object of this invention to provide a surface passivated semiconductor device utilizing both silicon dioxide and silicon nitride layers wherein the use of silicon nitride would provide different electrical characteristics than the use of silicon dioxide thereby providing an improved semiconductor device.

It is still a further object of this invention to provide an improved fabrication method for making semiconductor devices having more than one insulating material.

It is still another object of this invention to provide an improved field effect transistor device.

It is still a further object of this invention to provide improved field effect transistor devices which can be fabricated in either a normally ON or normally OFF state.

It is still an additional object of this invention to provide improved transistor devices utilizing both silicon dioxide and silicon nitride insulating regions.

It is still a further object of this invention to provide improved passive devices utilizing both silicon dioxide and silicon nitride insulating regions.

It is still another object of this invention to provide a resistor-capacitor device utilizing silicon dioxide and silicon nitride surface layers to provide different capacitive effects.

It is still a further object of this invention to provide an improved resistor-capacitor semiconductor device which utilizes different insulating materials having different thicknesses to provide different electrical operating characteristics.

In accordance with one embodiment of this invention a semiconductor device is described which comprises a monocrystalline semiconductor substrate having regions of opposite type conductivity. In one embodiment, the substrate consists of a body of preferably P-type material having two spaced N-type regions, thereby providing a field effect device which can be made in either a normally ON or normally OFF condition, as desired. Two different insulating layers are provided on the surface of the substrate. One of the insulating layers consists of silicon nitride and has a smaller thickness than the other insulating layer. Preferably, the other insulating layer is silicon dioxide which can be formed by using the silicon nitride layer as a masking layer on the semiconductor body and thermally growing the silicon dioxide layer on the remaining surface of the substrate. A current carrying conductive metal land pattern is located on a surface portion of each of the two insulating layers thereby providing a high capacitive effect on the portion of the semiconductor substrate located beneath the silicon nitride layer and a low capacitive effect on the portion of the semiconductor substrate located beneath the other insulating layer. In other embodiments, transistor devices and resistor-capacitor devices are described using both silicon nitride and silicon dioxide regions to provide an improved electrical device.

In accordance with another embodiment of this invention a method of fabricating a semiconductor device is described which comprises forming a silicon nitride layer over a selected surface portion of a semiconductor body. A silicon dioxide layer is formed on the remaining surface portion of the semiconductor body and a current carrying conductive metal land pattern is formed on both the silicon nitride layer and silicon dioxide layer.

The foregoing and other objects, features and advantages of the invention will be apparent from the following more particular description of the preferred embodiments of the invention, as illustrated in the accompanying drawings.

In discussing the semiconductor fabrication method, the usual terminology that is well known in the transistor field will be used. In discussing concentrations, references will be made to majority or minority carriers. By "carriers" is signified the free-holes or electrons which are responsible for the passage of current through a semiconductor material. Majority carriers are used in reference to those carriers in the material under discussion, i.e., holes in P-type material or electrons in N-type material. By use of the terminology "minority carriers" it is intended to signify those carriers in the minority, i.e., holes in N-type material or electrons in P-type material. In the most common type of semiconductor materials used in present day transistor structure, majority carrier concentration is generally due to the concentration of the "significant impurity," that is, impurities which impart conductivity characteristics to extrinsic semiconductor materials.

Although for the purpose of describing this invention reference is made to semiconductor configurations wherein one type region is utilized as the substrate and subsequent semiconductor regions of the composite semiconductor structure are formed in the conductivity type described, it is readily apparent that the same regions that are referred to as being of one conductivity type can be of the opposite type conductivity and furthermore, some of the operations which are described as diffusion operations can be made by epitaxial growth and some of the epitaxial growth regions can also be fabricated by diffusion techniques.

Figure 1:
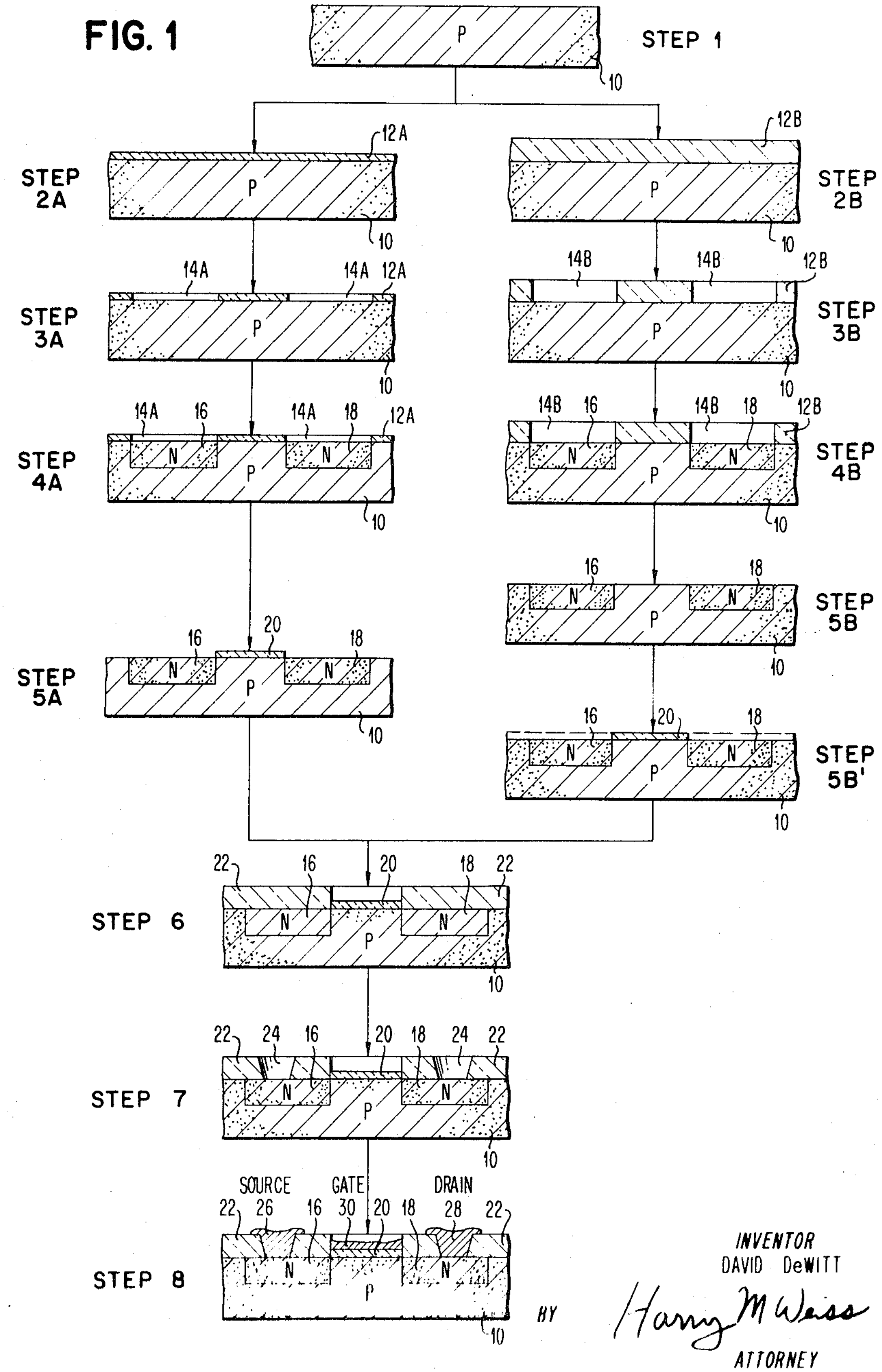
FIG. 1 is a flow diagram in cross section of the steps showing the fabrication process for making a normally OFF field effect transistor in accordance with the principles of this invention.

Referring to FIG. 1, step 1 depicts preferably a P-type substrate 10 approximately 5 to 10 mils thick and having a resistivity of between 0.1 to 10 ohm-centimeters. It is obvious to those skilled in the art that an N-type substrate could be used as the starting material and hence, the remaining steps of the process would be modified to conform to the various conductivity regions that are formed.

Two branches, (steps 2A, 3A, 4A and 5A) and (steps 2B, 3B, 4B, 5B, and 5B'), are shown in FIG. 1 to indicate alternative ways in which one semiconductor device in accordance with the principles of this invention can be fabricated. In step 2A, a thin silicon nitride coating 12A, preferably between 800–2,400 Angstrom units thick, is deposited by an RF sputtering method as disclosed in U.S. Pat. No. application Ser. No. 554,131, filed May 31, 1966, in the names of Davidse and Maissel, entitled "Method for Sputtering," and assigned to the same assignee as this invention. Depositing the silicon nitride coating 12A in this manner prevents the formation of an inverted surface region of N-type conductivity across the silicon surface in contact with the deposited insulating layer.

Following this operation, holes 14A (step 3A) are selectively opened up in the silicon nitride layer 12A by either using conventional photolithographic masking techniques and then etching using a highly concentrated HF solution or by reverse sputtering techniques, such as described in U.S. Pat. application Ser. No. 502,986, filed Oct. 23, 1965, in the names of Barson and Sturm, entitled "Ion Bombardment Cleaning," and assigned to the same assignee as this invention.

In step 4A, and N-type diffusion operation is performed using conventional diffusion techniques to form N-type regions 16 and 18 in the semiconductor body 10. The depth of the diffused regions is preferably in the range of 2 to 4 microns and the concentration of N-type impurities at the surface ($C_o$) is approximately $10^{19}$ to $10^{20}$ atoms per cubic centimeter. The channel or distance between diffused regions being about 3 to 50 microns wide.

Referring to step 5A, silicon nitride region 20, located on the semiconductor surface between diffused regions 16 and 18, is left intact on the surface of the semiconductor body 10 while the remaining silicon nitride surface regions are removed by etching or reverse sputtering techniques, after proper masking of silicon nitride region 20. The resulting structure, shown in step 5A, is the same structure that is shown in step 5B'; however, the alternative fabrication process, depicted by steps 2B, 3B, 4B, and 5B, is different.

Referring to step 2B, a silicon dioxide layer 12B, approximately 5,000 to 10,000 Angstrom units thick, is formed on the substrate 10 by either pyrolytic deposition or conventional thermal growth techniques in a steam atmosphere.

Holes 14B are opened up in the oxide layer 12B, in step 3B, by means of conventional photolithographic masking and etching techniques.

N-type diffused regions 16 and 18 are formed in the semiconductor body 10, as was done in step 4A, in step 4B.

In step 5B, the oxide masking layer 12B is removed by conventional etching techniques and the semiconductor surface is cleaned and prepared for a subsequent deposition operation.

Referring to step 5B', a silicon nitride coating is applied to the semiconductor surface and is subsequently selectively either etched or sputtered away, as shown by the dotted lines, to leave a silicon nitride region 20 on the surface of the device, as shown in step 5A. If desired, the silicon nitride region 20 can be formed through a mask.

Referring to step 6, which is the next step in the fabrication process after either step 5A or step 5B', a silicon dioxide layer 22, about 5,000 to 10,000 Angstrom units thick, is either thermally grown, formed by pyrolytic deposition or by RF sputtering techniques on the semiconductor surface about the silicon nitride region 20. Where the silicon dioxide layer 22 is thermally grown, the silicon nitride region 20 acts as a mask to prevent the formation of $SiO_2$ beneath region 20. However, if the silicon dioxide layer is pyrolytically deposited or RF sputtered, then the region 20 is masked to prevent the oxide from being deposited thereon. As is shown in the drawing, the silicon dioxide layer 22 is substantially thicker than the silicon nitride portion 20. The ratio of thickness of silicon dioxide to silicon nitride is preferably on the order of about 8 to 1.

In step 7, holes 24 are opened up in the oxide layer 22 using standard photolithographic masking and etching techniques so as to expose surface portions of the diffused regions 16 and 18 which will subsequently serve as source and drain regions, respectively, of the fabricated field effect transistor device.

In step 8, a metal layer, preferably aluminum, is deposited on the entire exposed semiconductor surface and then by conventional masking and etching techniques the ohmic contacts 26 and 28 and the conductive land patterns are formed which include the gate electrode. The silicon nitride region 20 is a substantially neutral dielectric material. Hence, contrary to silicon dioxide, there are no charges stored in the silicon nitride insulating material which would cause the creation of a channel to be formed in the semiconductor body 10 beneath the silicon nitride region 20. If silicon dioxide were used for the region 20, a normally ON semiconductor device would be formed due to the positive charges stored in the silicon dioxide material thereby creating an N-type inversion channel on the surface of the P-type body 10 between the diffused regions 16 and 18.

As shown in step 8 of FIG. 1, two insulating layers are used on the surface of the semiconductor device. The vary thin silicon nitride layer or region 20 beneath the gate electrode serves to permit very low voltages to be applied to the gate electrode to form an N-type or inverted channel in the semiconductor surface between the two diffused N-type regions 16 and 18, producing a device of low switching voltage and high transconductance. The thin silicon nitride region 20 provides a high capacitor effect between the gate electrode 30 and the semiconductor surface whereas, the thick silicon dioxide region 22 serves to produce a very low capacitance between metal lands lying on the silicon dioxide surface and the silicon surface beneath the silicon dioxide region. Since any capacitance to the silicon substrate from leads carrying signal voltages lowers the frequency response and switching speed of the device, it is desired to minimize such capacitance. In this manner, through use of two different insulating regions, a field effect device as shown in step 8 of FIG. 1 has improved performance over field effect devices made with just one type of insulating layer. The use of silicon nitride beneath the gate electrode makes a very high capacitor effect possible whereas substitution of silicon dioxide would not be adequate since silicon dioxide does not have the high dielectric constant and mechanical strength of silicon nitride.

Figure 2:
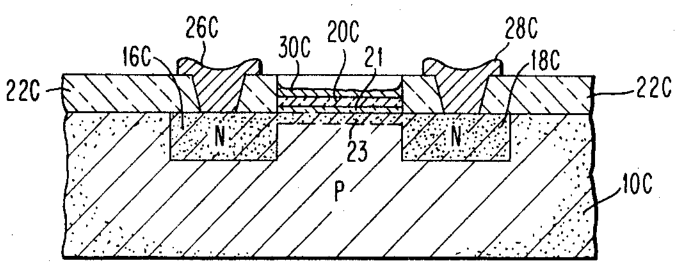
FIG. 2 is a cross sectional view of a normally ON field effect transistor device made in accordance with the principles of this invention.

Referring to FIG. 2, a field effect transistor device is shown in a normally ON state wherein the letter C has been added to each of the corresponding reference numerals of the configuration of step 8 of FIG. 1. In the embodiment of FIG. 2, the silicon nitride region 20C is not in contact with the semiconductor surface. However, beneath the silicon nitride region 20C, an insulating region 21 is provided, preferably of silicon dioxide, for creating N-type channel 23 between diffused regions 16C and 18C.

The fabrication of the device of FIG. 2 can be accomplished by growing or depositing a silicon dioxide layer of 100 to 500 Angstrom units thickness on top of the substrate 10 of FIG. 1, step 1. A portion of this silicon dioxide layer will form the layer 21 of FIG. 2. Silicon nitride is then deposited on top of the silicon dioxide layer. The silicon nitride material can be formed by either pyrolytic deposition such as described in U.S. Pat. application Ser. No. 494,790, filed Oct. 11, 1965, in the names of Doo, Nichols and Silvey, entitled "A Method for Depositing Continuous Pinhole-Free Silicon Nitride Films and Products Produced Thereby," and assigned to the same assignee as this invention, or by RF sputtering, such as described in U.S. Pat. application Ser. No. 494,789, filed Oct. 11, 1965, in the name of Pennebaker, entitled "Method for Depositing Insulating Films and Electric Devices Incorporating Such Films," and assigned to the same assignee as this invention. Step 3A is then performed, with both the overlying silicon nitride and the underlying silicon dioxide removed to expose the silicon in the regions 14A. The diffusion of step 4A is then performed, followed by step 5A, in which both the silicon nitride and the silicon dioxide are removed everywhere but in the area of region 20. Steps 6, 7 and 8 are then performed to produce the structure of FIG. 2. The oxide region 21 which stores positive charges, causes the N-type channel 23, which is usually about 100 to 10,000 Angstrom units thick, in the silicon between the diffused source 16C and drain 18C regions.

Accordingly, the field effect transistor device of FIG. 2 is a normally ON device wherein the N-type channel 23 links N-type source region 16C and N-type drain region 18C. Upon application of the desired potential to the gate electrode, the N-type channel is removed to place the device in an OFF condition. The combined use of silicon dioxide and silicon nitride beneath the gate electrode 30C is advantageous due to the fact that the silicon dioxide layer or region 21 in contact with the semiconductor surface serves to invert the semiconductor surface to form the N-type channel while the use of silicon nitride region 20C between the gate electrode 30C and the silicon dioxide region 21 provides protection of the silicon dioxide region 21 and permits a high capacitance to be obtained between the gate electrode 30C and the semiconductor surface. The composite thickness of the silicon dioxide region 21 and the silicon nitride region 20C should be made as small as possible to provide a high capacitor effect and to permit low voltage to be applied to the gate electrode to operate the field effect device. Preferably, the composite thickness of the silicon nitride region and the silicon dioxide region should be no more than about a few thousand Angstroms. In this manner, as was described above with respect to FIG. 1, the use of different insulators between the gate electrode and semiconductor surface and between the conductive land and the semiconductor device provides a better operating field effect device.

Figure 3:
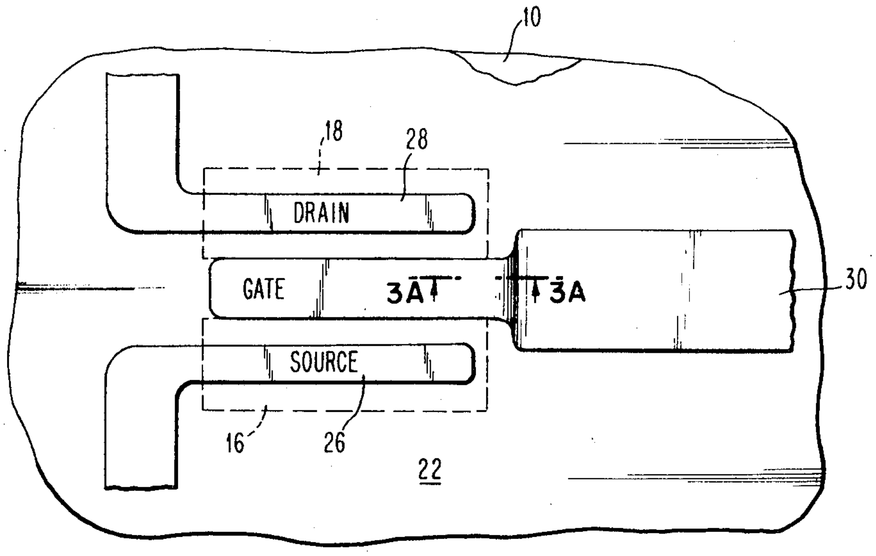
FIG. 3 is a partial planar view of the conductive land pattern on the insulating surface portions of the semiconductor device of FIG. 1.
Figure 3A:
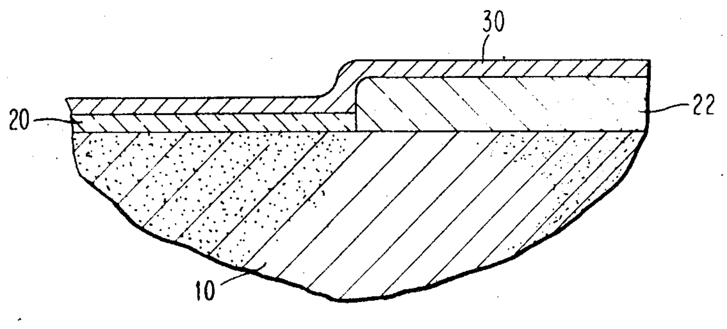
FIG. 3A is a sectional view taken on line 3A—3A of FIG. 3.

Referring to FIG. 3, a partial planar view is shown of the conductive lands on the surface of the semiconductor device of FIG. 1. Diffused regions 16 and 18 are shown by phantom or dotted lines. The gate electrode 30 is shown, with reference to FIG. 3A, as being closer to the semiconductor surface at one portion, namely where the silicon nitride region 20 is located and further from the semiconductor surface where the silicon dioxide region 22 is located so as to provide the desired high capacitance effect below the gate electrode and the low capacitance effect over the remaining semiconductor surface due to the thicker silicon dioxide region. Accordingly, the source and drain lands are located on the surface of the silicon dioxide region 22 and ohmic contact is made through the openings in the silicon dioxide region 22.

Figure 4:
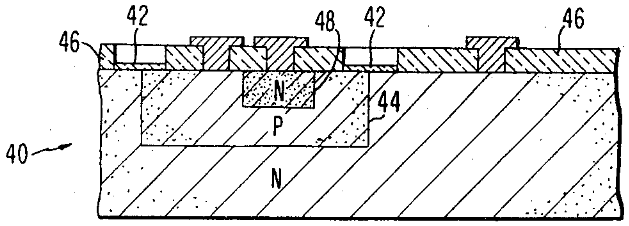
FIG. 4 is a sectional view of a transistor structure utilizing a silicon nitride layer on the surface thereof at the surface region of the base-collector junction.

Referring to FIG. 4, an improved transistor device 40 is shown wherein a thin silicon nitride guard ring 42 is provided on the semiconductor surface of an NPN transistor at the surface region of base-collector junction 44. The thin silicon nitride region 42 provides, because of its high voltage breakdown characteristics, an extremely good insulator for use at critical regions on the surface of the semiconductor device. Normally, at the surface of the semiconductor device where the PN junction 44 is located, electric fields formed at the junction 44 cause charge carriers to flow through the insulating material. However, the use of the silicon nitride ring 42 over the junction 44, instead of a continuous insulating or silicon dioxide layer 46, prevents the charge carriers from flowing through the silicon nitride across the junction and thereby prevents leakage and/or degradation of the junction 44. It should be evident that another silicon nitride ring can also be used on the semiconductor surface at base-emitter junction 48, if desired. While reference is made to an NPN transistor device, it is readily apparent that other devices can be used including diodes and PNP transistor devices. Hence, use of more than one insulating material including silicon nitride provides an improved semiconductor device.

Figure 4A:
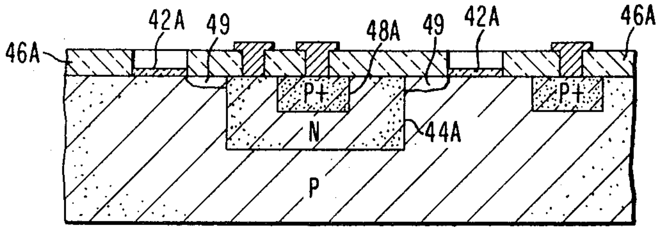
FIG. 4A is a cross sectional view of a transistor device utilizing an annular layer of silicon nitride on the semiconductor surface for breaking up an undesirable surface inverted layer.

FIG. 4A refers to a PNP transistor structure wherein a silicon nitride guard ring 42A is used on the surface portion of a P-type semiconductor region. Reference numerals for this figure correspond to the similar numerals for FIG. 4 with the addition of the letter A. The silicon nitride guard ring 42A prevents N-type inversion, which normally appears at the surface of a P-type body due to the silicon dioxide surface material, due to the neutral state that silicon nitride possesses if deposited as described with regard to FIG. 1. Therefore, shorting of the electrical device of FIG. 4A by channel 49 is prevented because of the use of a surface guard ring of neutral type silicon nitride material.

Figure 5:
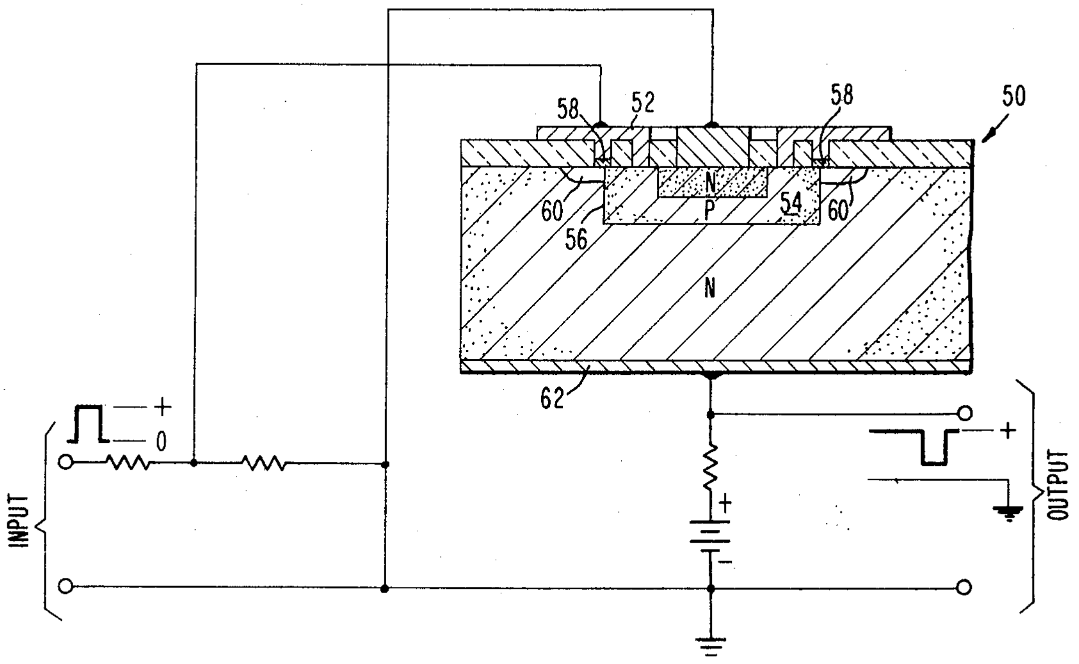
FIG. 5 is a sectional view of a transistor device utilizing an annular field electrode in combination with an annular silicon nitride layer for electric field control at the semiconductor surface where a PN junction is located.

FIG. 5 illustrates a semiconductor device 50 wherein a conductive land 52 is extended, from ohmic contact with base region 54 over a surface portion of the semiconductor device so as to permit control of the electrical field at base-collector junction 56. A silicon nitride ring layer 58 is formed at the semiconductor surface so as to provide a high capacitance effect at the base-collector surface junction 56 thereby inverting a portion of the collector surface portion adjacent the base-collector surface junction 56 as shown by numeral 60. Hence, the breakdown voltage of the base-collector junction 56 is increased thereby permitting improved device operation. In this embodiment, a battery potential of about 50 volts is applied to collector electrode 62. The emitter electrode is at ground potential and the base electrode is at a potential of about +0.8 volts. Hence, by virtue of the high electric field at the region of the thin silicon nitride ring 42A an inverted P-type region is formed and electrical breakdown of the semiconductor device is increased.

Figure 6:
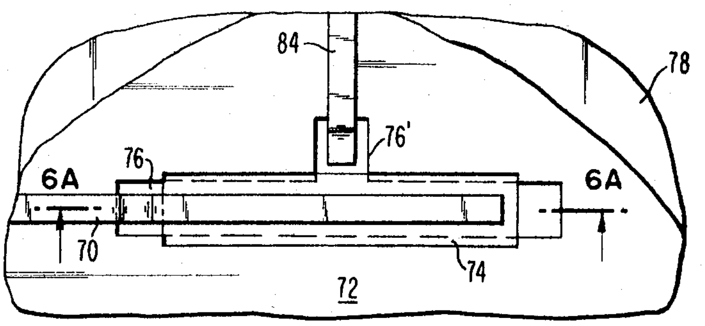
FIG. 6 is a partial planar view showing the conductive land configuration, the outline of the diffused region, and the outline of the silicon nitride layer of a resistor-capacitor device in accordance with the principles of this invention.
Figure 6A:
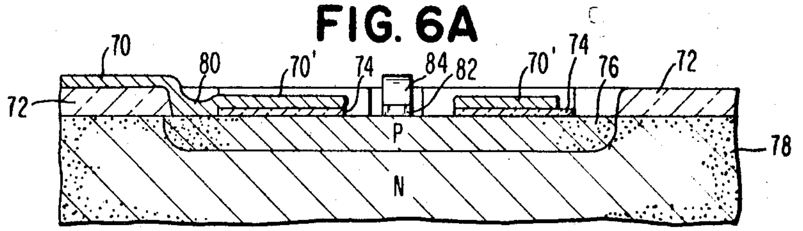
FIG. 6A is a cross sectional view taken along the line 6A—6A of FIG. 6 with the view of the central portion of the capacitor land broken away to show one resistor contact.
Figure 6B:
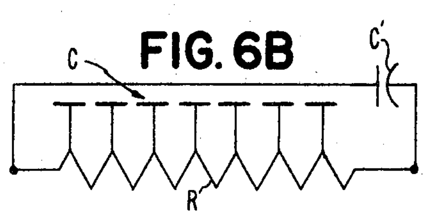
FIG. 6B is an electrical schematic view of the device shown in FIGS. 6 and 6A.

With reference to FIG. 6, a partial planar view of a resistor capacitor device is shown. A metal conductive land 70 extends over silicon dioxide surface 72 and over silicon nitride region 74 which is in contact with a P-type diffused region 76 located in an N-type substrate region 78. With reference to FIG. 6A, an ohmic contact 80 is formed by the conductive land 70 in contact with the diffused P-type region 76. Similarly, a second ohmic contact 82 is formed by the portion of conductive land 84 that is in contact with an extended region 76′ of the diffused region 76 (FIGS. 6 and 6A). Accordingly, by this arrangement, ohmic contacts 80 and 82 provide the resistance R shown schematically in FIG. 6B. The resistance R is determined by the conductivity of the P-type region 76. In addition, a capacitor C is formed by the conductive land portion 70 of FIG. 6A and the P-type region 76 which is shown by means of a plurality of capacitor plates in FIG. 6B. The solid line above the capacitor plates in FIG. 6B represents the conductive land extension 70′ while the individual capacitor plates represent the capacitance at various points along the diffused P-type region 76. An additional capacitor C′ is formed by the spacing between the free end of conductive land 70′, which extends beyond the region of the conductive land 84, and the portion of the diffused region 76 located adjacent thereto. Consequently, the use of both silicon nitride and silicon dioxide in the embodiment illustrated in FIGS. 6, 6A and 6B permits the formation of a semiconductor device utilizing a thin silicon nitride region to provide a high capacitance effect and a thick silicon dioxide region to minimize capacitance effects.

Figure 7:
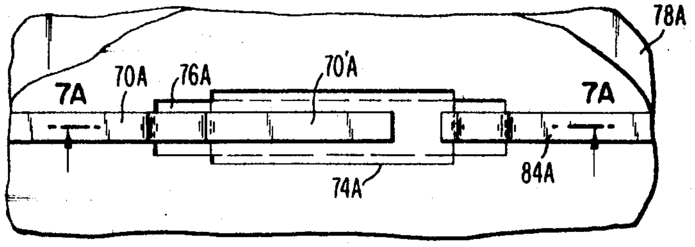
FIG. 7 is a partial planar view of another resistor-capacitor device embodiment in accordance with this invention.
Figure 7A:
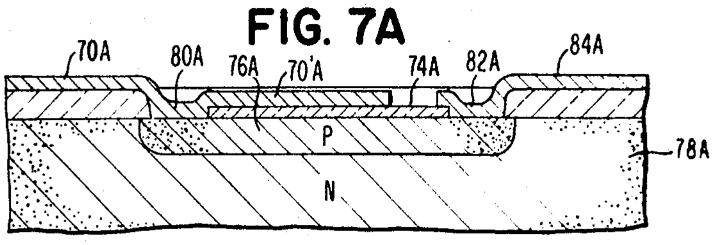
FIG. 7A is a cross sectional view taken along the line 7A—7A of FIG. 7.
Figure 7B:
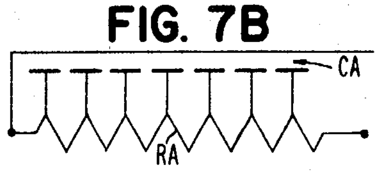
FIG. 7B is an electrical schematic view of the electrical device shown in FIGS. 7 and 7A.

Similarly, with reference to the embodiment shown in FIGS. 7, 7A and 7B, a resistor-capacitor device is shown wherein corresponding reference numerals of FIGS. 6, 6A and 6B are used with the addition of the letter A to denote the similar elements in FIGS. 7, 7A and 7B. However, in the embodiment of FIGS. 7, 7A, and 7B there is essentially only one capacitor formed which is created by the conductive land extension 70′A being capacitively associated with the P-type diffused region 76A. Ohmic contacts are made at 80A and 82A by conductive lands 70A and 84A, respectively.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A field effect transistor comprising, in combination a monocrystalline semiconductor substrate of one type conductivity having formed therein two spaced regions of another type conductivity, each extending from one surface of said substrate;

a first insulating layer comprising a composite of a lower layer of silicon dioxide and an upper layer of silicon nitride covering said surface between said two spaced regions;

a second insulating layer consisting of silicon dioxide covering portions of said surface not covered by said first insulating layer;

a gate electrode located on said silicon nitride layer;

ohmic contacts to each of said two regions respectively to provide source and drain connections;

a current carrying conductive metal land pattern located on said gate and on said second insulating layer of silicon dioxide and connected respectively to said gate electrode and said ohmic contacts.

2. A field effect transistor comprising, in combination a monocrystalline semiconductor substrate of one type conductivity having formed therein two spaced regions of another type conductivity, each extending from one surface of said substrate;

a first insulating layer comprising a composite of a lower layer of silicon dioxide and an upper layer of silicon nitride covering said surface between said two spaced regions;

a second insulating layer comprising a silicon dioxide layer having a greater thickness than said first layer covering portions of said surface not covered by said first insulating layer;

a gate electrode located on said silicon nitride layer;

ohmic contacts to each of said two regions respectively to provide source and drain connections;

a current carrying conductive metal land pattern located on said gate and said second insulating layer and connected respectively to said gate electrode and said ohmic contacts thereby providing a high capacitive effect on the portion of said semiconductor substrate located beneath said first insulating layer and a low capacitive effect on the portion of said semiconductor substrate located beneath said second insulating layer.

3. The field effect transistor of claim 2 wherein said second insulating layer consists of a silicon dioxide layer and covers said two spaced regions, and said land pattern connected to said ohmic contacts is on the surface of said silicon dioxide layer.

4. The field effect transistor of claim 3 wherein said substrate is of P-type conductivity and said spaced regions are of N-type conductivity.

5. The field effect transistor of claim 3 wherein said substrate is of N-type conductivity and said spaced regions are of P-type conductivity.

6. A semiconductor device comprising, in combination, a monocrystalline semiconductor substrate having two regions of N-type conductivity provided in a semiconductor body of opposite type conductivity;

ohmic contact to each of said two regions providing source and drain connections, respectively;

two different insulating layers located on a surface of said substrate, one of said insulating layers consisting of silicon nitride and having a smaller thickness than the other insulating layer consisting of silicon dioxide;

a thin silicon dioxide layer located on the surface of said semiconductor body between said tow N-type regions thereby forming an N-type inverted channel along the semiconductor surface between said two regions of N-type conductivity, said silicon nitride layer being located on said thin silicon dioxide layer;

a gate electrode located on the surface of said silicon nitride layer and a current carrying conductive metal land pattern located on a surface portion of said silicon dioxide insulating layer; thereby providing a low capacitive effect on the portion of said semiconductor substrate located beneath said silicon dioxide insulating layer and a high capacitive effect on the portion of the semiconductor substrate located beneath said silicon nitride layer.

7. A semiconductor device comprising, in combination, a monocrystalline semiconductor substrate having regions of opposite type conductivity;

two different insulating layers located on a surface of said substrate, one of said insulating layers consisting of silicon nitride and having a smaller thickness than the other insulating layer consisting of silicon dioxide;

said substrate comprising emitter, base and collector regions of a transistor device, said silicon nitride layer being located on the semiconductor surface at the surface region of the base-collector junction of the transistor; and a current carrying conductive metal land pattern located on a surface portion of each of said two insulating layers thereby providing a high capacitive effect on the portion of said semiconductor substrate located beneath said silicon nitride layer and a low capacitive effect on the portion of said semiconductor substrate located beneath said other insulating layer.

8. A semiconductor device in accordance with claim 7 wherein said silicon nitride layer has a substantially annular configuration.

9. A semiconductor device comprising, in combination, a monocrystalline semiconductor substrate having regions of opposite type conductivity;

two different insulating layers located on a surface of said substrate, one of said insulating layers consisting of silicon nitride and having a smaller thickness than the other insulating layer consisting of silicon dioxide;

said substrate comprising emitter, base and collector regions of a transistor device, said silicon nitride layer having a substantially annular configuration and located on the surface of a P-type region to prevent the formation of an N-type inversion channel across the P-type surface region; and a current carrying conductive metal land pattern located on a surface portion of each of said two insulating layers thereby providing a high capacitive effect on the portion of said semiconductor substrate located beneath said silicon nitride layer and a low capacitive effect on the portion of said semiconductor substrate located beneath said other insulating layer.

10. A semiconductor device comprising, in combination, a monocrystalline semiconductor substrate having regions of opposite type conductivity;

two different insulating layers located on a surface of said substrate, one of said insulating layers consisting of silicon nitride and having a smaller thickness than the other insulating layer consisting of silicon dioxide;

said substrate comprising emitter, base and collector regions of a transistor device; and a current carrying conductive metal land pattern located on a surface portion of each of said two insulating layers thereby providing a high capacitive effect on the portion of said semiconductor substrate located beneath said silicon nitride layer and a low capacitive effect on the portion of said semiconductor substrate located beneath the other insulating layer, said land pattern including a metal base ohmic contact having a substantially annular extended portion located on a surface portion of said silicon dioxide layer, and a substantially annular metal portion extending from said annular extended portion and located adjacent to the base-collector junction of said transistor device;

said silicon nitride layer having a substantially annular configuration and located between said substantially annular metal portion and the surface region of said base-collector junction.

11. A semiconductor device comprising, in combination, a monocrystalline semiconductor substrate having regions of opposite type conductivity;

two different insulating layers located on a surface of said substrate, one of said insulating layers consisting of silicon nitride and having a smaller thickness than the other insulating layer consisting of silicon dioxide, said silicon nitride layer being located above a semiconductor region of one type conductivity; and a current carrying conductive metal land pattern located on a surface portion of each of said two insulating layers thereby providing a high capacitive effect on the portion of said semiconductor substrate located beneath said silicon nitride layer and a low capacitive effect on the portion of said semiconductor substrate located beneath the other insulating layer;

said land pattern including a first current carrying electrode located on a surface portion of said silicon dioxide layer, said first current carrying electrode extending over a surface portion of said silicon nitride layer and having a portion in ohmic contact with the semiconductor region of said one type conductivity; and a second current carrying electrode extending over a surface portion of said silicon dioxide layer and forming an ohmic contact through an opening in said silicon dioxide layer to the semiconductor region of said one type conductivity.

12. A semiconductor device comprising, in combination, a monocrystalline semiconductor substrate having two regions of P-type conductivity provided in a semiconductor body of opposite type conductivity; ohmic contact to each of said two regions providing source and drain connections, respectively;

two different insulating layers located on a surface of said substrate, one of said insulating layers consisting of silicon nitride and having a smaller thickness than the other insulating layer consisting of silicon dioxide;

a thin silicon dioxide layer located on the surface of said semiconductor body between said two P-type regions thereby forming a P-type inverted channel along the semiconductor surface between said two regions of P-type conductivity, said silicon nitride layer being located on said thin silicon dioxide layer;

a gate electrode located on the surface of said silicon nitride layer; and a current carrying conductive metal land pattern located on a surface portion of said silicon dioxide insulating thereby providing a low capacitive effect on the portion of said semiconductor substrate located beneath said silicon dioxide insulating layer and a high capacitive effect on the portion of the semiconductor substrate located beneath said silicon nitride layer.

* * * * *